(12) United States Patent
Nozuyama et al.

(10) Patent No.: US 8,185,863 B2
(45) Date of Patent: May 22, 2012

(54) DELAY FAULT TEST QUALITY CALCULATION APPARATUS, DELAY FAULT TEST QUALITY CALCULATION METHOD, AND DELAY FAULT TEST PATTERN GENERATION APPARATUS

(75) Inventors: Yasuyuki Nozuyama, Inagi (JP); Atsuo Takatori, Kawasaki (JP)

(73) Assignees: Kabushiki Kaisha Toshiba, Tokyo (JP); Fujitsu Semiconductor Limited, Kanagawa (JP)

( * ) Notice: Subject to any disclaimer, the term of this patent is extended or adjusted under 35 U.S.C. 154(b) by 0 days.

(21) Appl. No.: 13/243,070

(22) Filed: Sep. 23, 2011

(65) Prior Publication Data

US 2012/0016619 A1 Jan. 19, 2012

Related U.S. Application Data

(62) Division of application No. 11/943,170, filed on Nov. 20, 2007, now Pat. No. 8,051,403.

(30) Foreign Application Priority Data

Nov. 21, 2006 (JP) ................................ 2006-314221

(51) Int. Cl.
G06F 11/22 (2006.01)
(52) U.S. Cl. ........ 716/136; 716/108; 716/110; 716/111; 716/112; 716/113; 714/724; 714/726; 714/728; 714/738; 703/19
(58) Field of Classification Search .................. 716/108, 716/110, 111, 112, 113, 136; 703/19; 714/724, 714/726, 728, 738
See application file for complete search history.

(56) References Cited

U.S. PATENT DOCUMENTS

| 7,162,674 | B2 | 1/2007 | Nozuyama | |
|---|---|---|---|---|
| 7,509,600 | B2 * | 3/2009 | Rajski et al. | ................... 716/136 |
| 7,512,508 | B2 | 3/2009 | Rajski et al. | |
| 2004/0205681 | A1 | 10/2004 | Nozuyama | |
| 2005/0010839 | A1 | 1/2005 | Takeoka et al. | |
| 2005/0182587 | A1 | 8/2005 | Sato et al. | |
| 2006/0005094 | A1 | 1/2006 | Nozuyama | |
| 2006/0031731 | A1 | 2/2006 | Ishida et al. | |

(Continued)

FOREIGN PATENT DOCUMENTS

JP 2003-316849 11/2003

(Continued)

OTHER PUBLICATIONS

Sato et al, Evaluation of the Statistical Delay Quality Model, Proc. IEEE Asian and South Pacific Design Automation Conference, 2005, pp. 305-310.

(Continued)

*Primary Examiner* — Thuan Do
*Assistant Examiner* — Nha Nguyen
(74) *Attorney, Agent, or Firm* — Turocy & Watson, LLP (57) ABSTRACT

A delay fault test quality calculation apparatus for calculating delay fault test quality to be achieved by a test pattern to be applied to a semiconductor integrated circuit includes a defect distribution extraction unit, a delay fault-layout element information extraction unit, and a weighting unit. The delay fault test quality calculation apparatus further includes a delay fault test quality calculation unit which calculates the delay fault test quality on the basis of delay design information of the semiconductor integrated circuit, detection information of the test pattern to test the semiconductor integrated circuit, execution conditions of the test, a physical defect distribution extracts the defect distribution extraction unit, and a weights adds the weighting unit.

5 Claims, 7 Drawing Sheets

U.S. PATENT DOCUMENTS

| | | |
|---|---|---|
| 2007/0201618 A1 | 8/2007 | Nozuyama |
| 2007/0226663 A1* | 9/2007 | Bormann et al. .................. 716/5 |
| 2007/0260408 A1 | 11/2007 | Nozuyama |

FOREIGN PATENT DOCUMENTS

| | | |
|---|---|---|
| JP | 2004-251895 | 9/2004 |
| JP | 2005-257654 | 9/2005 |

OTHER PUBLICATIONS

Hamada et al, Recognition of Sensitized Longest Paths in Transition Delay Test, Proc. IEEE International Test Conference, 2006, Paper 11.1.

Sato et al, Feasibility Evaluation of the Statistical Delay Model (SDQM)*, Technical Report of IEICE, 2006, vol. J89-D, No. 8, pp. 1717-1728, Japan.

Sato et al, Invisible Delay Quality-SDQM Model Lights Up What Could Not Be Seen, Proc. IEEE International Test Conference, 2005, p. 47.1.

Li et al, A Circuit Level Fault Model for Resistive Opens and Bridges, Session 11B-1, VTS 2003, 2003.

Qui et al, CodSim—A Combined Delay Fault Simulator, IEEE 2003.

Lu et al, A Circuit Level Fault Model for Resistive Shorts of MOS Gate Oxide, IEEE 2004.

Bareisa et al, Delay Faul Models and Metric, Information Technology and Control, vol. 34, No. 4, 2005.

U.S. Office Action for U.S. Appl. No. 11/943,170 mailed on Jul. 2, 2010.

U.S. Office Action for U.S. Appl. No. 11/943,170 mailed on Jan. 1, 2011.

U.S. Office Action for U.S. Appl. No. 11/943,170 mailed on May 6, 2011.

* cited by examiner

DELAY FAULT TEST QUALITY CALCULATION APPARATUS, DELAY FAULT TEST QUALITY CALCULATION METHOD, AND DELAY FAULT TEST PATTERN GENERATION APPARATUS

CROSS-REFERENCE TO RELATED APPLICATIONS

This application is a Division of application Ser. No. 11/943,170 filed Nov. 20, 2007, which is based upon and claims the benefit of priority from prior Japanese Patent Application No. 2006-314221, filed Nov. 21, 2006, the entire contents of both of which are incorporated herein by reference.

BACKGROUND OF THE INVENTION

1. Field of the Invention

The invention relates to a delay fault test technique to be used for a semiconductor integrated circuit. More specifically, the present invention relates to a calculation apparatus for calculating delay fault test quality, a method for calculating the quality thereof, and a delay fault test pattern generation apparatus.

2. Description of the Related Art

In recent years, a delay fault has become worse in accordance with high performance and high frequency of a semiconductor integrated circuit (hereinafter referred to as a large scale integrated circuit [LSI]). Conventionally, in the case in which the LSI cannot operate normally at a prescribed test frequency, the cause is called a delay defect.

As to the most basic fault model corresponding to the delay fault (defect), there are a transition fault model and a path delay fault model. The former is the simplest delay fault model and is effective to detect a large delay fault (delay defect) inside the LSI. The transition fault is assumed as slow-to-rise or slow-to-fall fault at an input and output terminal of a connection net or a basic cell inside a target LSI. The former has practical advantages that it simply comes out by a simple expansion of a stuck-at fault model and it may treat the delay faults in a comprehensive manner. On the contrary, the latter assumes the delay fault in each logical path in the target LSI, although it has an advantage capable of detecting distributed delays on the logical paths, the number of the logical paths becomes huge, and also a large number of redundant paths exist therein. Therefore, there are problems such that, in many case, applying a test pattern poses an extremely low value of a fault coverage, namely the number of tested logical paths/the number of all logical paths, and it is very hard to estimate the degree of the delay fault test quality. Because of such a reason, in general, the transition fault model has been widely used.

However, with respect to an LSI to be manufactured in recent fine process, physical defects which cause fine ((very) small) delays increase in number, so that a generation of a test pattern corresponding to a conventional generic transition fault model cannot sufficiently detect a physical defect causing a fine delay fault. Accordingly, the situation in which the delay fault is exposed after the shipment of the LSI has become worse.

Therefore, to detect the physical defect causing a fine delay fault, many proposals have been presented. A representative proposal generates a test pattern so as to detect the physical defect causing a fine delay fault by a logical path almost the longest path as much as possible on the basis of the transition fault model capable of detecting the defect in a comprehensive manner. However, this proposal is an effort to detect further many physical defects causing a fine delay fault, does not answer a question that the delay fault test quality of the test pattern, which has been actually obtained as a result, is to which degree, so that a suitable quality index is desired.

With respect to the estimation of the delay fault test quality, a variety of proposals have been presented. Especially, in a patent document 1 (e.g., Jpn. Pat. Appln. KOKAI No. 2005-257654), the proposal put together into one quality index from a comprehensive point of view. That is, in patent document 1, the proposal calculates the delay fault test quality with high precision, based on the delay fault coverage, and delay (timing) design information (e.g., static timing analysis information) of the target LSI, test timing precision (test frequency) information of a test pattern applied to the target LSI, and common delay defect distribution information. In the case of patent document 1, there is a large advantage in that an experimental question that an occurrence rate of delay faults is low in some products, and high in other products even with the same delay fault coverage may be explained reasonably, and it has found a course capable of estimating an actual market delay fault (defect) rate level with high precision.

A patent document 2 (e.g., Jpn. Pat. Appln. KOKAI Publication No. 2004-251895) proposes to estimate the delay fault test quality with high precision by adding layout information to the delay fault.

In another point of view, as to enhancing precision of a fault model, in a non-patent document (e.g., Zhuo Li, et al., "A Circuit Level Fault Model for Resistive Opens and Bridges", Session 11 B-1, VTS 2003, 2003.), the quality improvement of generation of the delay fault test is confirmed by modeling a resistive defect that is a main cause of the delay fault in a circuit level.

However, patent document 1 only proposes an indirect method, such as a method for directly obtaining through a test element group (TEG) measurement (hard in reality) and a method for estimating by evaluating a large number of samples of target products (obtaining optimum solutions of the target products is delayed, and hard to develop the estimation result for other products), in a manner how to obtain a delay fault distribution that is the start point of a measure (metric) of the delay fault test quality. While patent document 1 assumes one kind of the delay defect distribution, (as disclosed in this patent specification), in an actual product the delay defect distribution of each delay fault differ much from that of the other, patent document 1 does not clearly describe a method for reasonably obtaining the way that which distributions should be employed, and then, it has not sufficiently disclosed the point to estimate the delay fault test quality of may products with high precision. In other words, although patent document 1 specifies that a direct distribution of delay defects (faults) is extracted from the common TEG, and the delay fault test quality is calculated on the basis of the extracted distribution, there is some doubt whether or not the delay defect distribution extracted from the common TEG can be applied as delay defect distributions of individual products as it is. The delay defect itself is expressed by abnormalities of further direct and common physical parameters (resistance [R] and capacitance [C]), and the parameters deeply depend on the unique layout of the product.

In patent document 2, since the weight to be added to the delay fault has not accurately responded to layout element information, there is every possibility that an appropriate delay defect distribution cannot be obtained. Although non-patent document 1 takes resistive faults into account, it does not reach the idea of combining the resistive faults with the physical defect distributions of the individual layout elements.

BRIEF SUMMARY OF THE INVENTION

According to a first aspect of the present invention, there is provided a delay fault test quality calculation apparatus for calculating delay fault test quality to be achieved by a test pattern to be applied to a semiconductor integrated circuit comprises:

a defect distribution extraction unit which extracts a physical defect distribution of resistance or current related to layout elements or a combination of the layout elements composing the semiconductor integrated circuit;

a delay fault-layout element information extraction unit which extracts the layout elements or the combination of the layout elements inside the semiconductor integrated circuit as delay fault-layout element information by associating the layout elements or the combination thereof with delay faults to be assumed inside the semiconductor integrated circuit;

a weighting unit which adds weights of the layout elements or the combination of the layout elements on the basis of the delay fault-layout element information for each delay fault; and a delay fault test quality calculation unit which calculates the delay fault test quality on the basis of delay design information of the semiconductor integrated circuit, detection information of the test pattern to test the semiconductor integrated circuit, execution conditions of the test, the physical defect distribution, and the weights.

According to a second aspect of the present invention, there is provided a delay fault test quality calculation method for calculating delay fault test quality to be achieved by a test pattern to be applied to a semiconductor integrated circuit comprises:

extracting a physical defect distribution of resistance or current related to layout elements or a combination of the layout elements composing the semiconductor integrated circuit;

extracting the layout elements or the combination of the layout elements inside the semiconductor integrated circuit as delay fault-layout element information by associating the layout elements or the combination thereof with delay faults to be assumed inside the semiconductor integrated circuit;

adding weights of the layout elements or the combination of the layout elements on the basis of the delay fault-layout element information for each delay fault; and calculating the delay fault test quality on the basis of delay design information of the semiconductor integrated circuit, detection information of the test pattern to test the semiconductor integrated circuit, execution conditions of the test, the physical defect distribution, and the weights.

According to a third aspect of the present invention, there is provided a delay fault test pattern generation apparatus for generating a delay fault test pattern comprises:

a defect distribution extraction unit which extracts a physical defect distribution of resistance or current related to layout elements or a combination of the layout elements composing the semiconductor integrated circuit;

a delay fault-layout element information extraction unit which extracts the layout elements or the combination of the layout elements inside the semiconductor integrated circuit as delay fault-layout element information by associating the layout elements or the combination thereof with delay faults to be assumed inside the semiconductor integrated circuit;

a weighting unit which adds weights of the layout elements or the combination of the layout elements on the basis of the delay fault-layout element information for each delay fault;

a test pattern generation unit which preferentially generates a test pattern for not-detected faults with heavy weights on the basis of weights of faults to which the weights are added by the weighting unit; and a delay fault test quality calculation unit which calculates the delay fault test quality on the basis of delay design information of the semiconductor integrated circuit, detection information of the test pattern to test the semiconductor integrated circuit, execution conditions of the test, the physical defect distribution, and the weights.

DETAILED DESCRIPTION OF THE INVENTION

Embodiment of the invention will be described with reference to the accompanying drawings. It should be noted that the drawings are schematic ones and the dimension ratios shown therein are different from the actual ones. The dimensions vary from therein are different from the actual ones. The dimensions vary drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

As mentioned above, while patent document 1 assumes one kind of the delay defect distribution for all faults, in an actual product the delay defect distribution of each delay fault differ from that of the other. Further, the delay distributions of a product may differ from those of another product. Therefore, there is still some doubt as to the application of the delay defect distribution extracted from the common TEG as it is as the delay defect distribution of the individual products. The delay defect should be originally represented by the combination (association) of abnormalities of the further direct and common physical parameters of basic elements constituting circuits of the individual products, especially R of (or the current [1/R] flowing through) an element, and the physical parameter (mainly, C) of the circuit elements to be affected by the abnormalities; and especially, the latter deeply depends on the unique layouts of the products. Further, the delay defect distribution deeply depends on the effective number and amounts of basic elements to be associated with (capable of suffering abnormalities) each delay fault to be assumed inside the product, and this fact depend heavily on the unique layout of the products, and this deal defect distribution deeply depends on the layouts unique to the products. Conversely, without extracting resistance (R) abnormality distribution caused by the physical defect to be targeted to the resistive open fault (defect) of a VIA/metal interconnect that is the most basic element from the common TEG, extracting effective number and quantity (length) of the VIA/metal interconnect to be associated with the delay fault of the product, and appropriately combining the extracted resistance (R) distribution and the extracted effective number and quantity (length), the estimation of the delay fault test quality in patent document 1 may not reached the test quality of the delay fault caused by the objected physical defect with high accuracy.

The embodiment described hereinafter will provide a delay fault test quality calculation apparatus, its calculation method and delay fault test pattern generation apparatus which are actualized by obtaining physical defect (failure) distributions of a various layout elements shared with at least specific process and manufacturing line and a delay defect distributions at each LSI on the basis of the information unique to each LSI including the layout information, and through test patterns aimed to detect the delay defect applied to each of the LSIs.

Thereby, for example, the test quality of the delay fault caused from the targeted physical defect may be calculated with high precision.

Some of the embodiments of the invention will be described with reference to the drawings. For this description, common parts will be designated common reference symbols over all Figures.

[First Embodiment]

At first, a concept of a measure (metric) of delay fault test quality described in patent document 1 will be explained.

Figure 1:
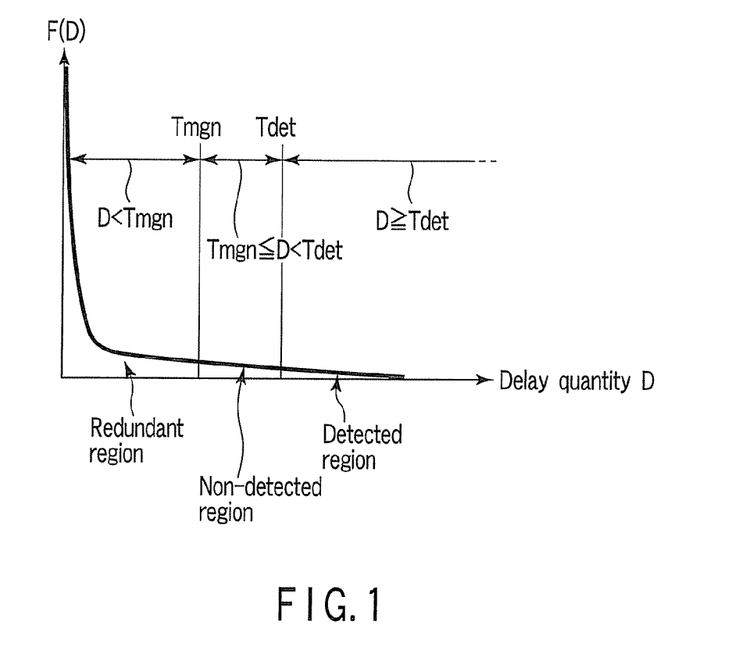
FIG. 1 is a preferred view illustrating a delay defect distribution to a certain fault together with a test pattern applying result to an LSI.

FIG. 1 shows a delay defect distribution (occurrence frequency distribution) F(D) to a certain failure i together with a result of test pattern applying to an LSI. Tmgn is, for example, a delay value accompanied by an "activatable" propagation path obtained by a timing analysis, and Tdet is a delay value accompanied by a propagation path can be activated by an actual test. D<Tmgn indicates a redundant region which is hard to be activated by any test pattern, and the region of D≧Tmgn is the region which should be tested essentially. Now, the delay in the region of Tmgn≦D<Tdet cannot be detected even when the delay fault(defect) actually occurs, therefore, the delay defect occurrence rate in the region of Tmgn≦D<Tdet contributes to the delay fault test quality (delay defect rate) of the fault. In the patent document No. 1, the method for obtaining the measure of the delay fault test quality assumes the same delay defect distribution F(D) to all the faults to calculate the defect rates in the region of Tmgn≦D<Tdet, sums the defect rates, and then, calculates the measure of the delay fault test quality based on the test pattern applied to the LSI.

In a generic LSI, since interconnect capacities vary for each individual logical net, the delay defect distribution F(D) is generally expressed as F(i,j) (D) (here, i is a logical net name, j is an input or output terminal name of a logical gate to be connected to a logical net). However, from a statistics view point, there is some possibility of enabling a suitable averaged value (distribution) to be defined, patent document 1 describes on the premise of the definition, but it does not describe a clear procedure. The first embodiment will bring this point into focus. More specifically, the procedure obtains the physical defect distribution expressed by resistances or currents of a target layout element (e.g., a via [hereinafter referred to as a VIA] of a minimum size) from the TEG, etc., on the other hand, the procedure extracts the distribution of the target layout elements from the layout information of the LSI in a form capable of associating the distribution thereof with the delay defects, obtains the delay defect distributions caused by the physical defect distributions of the target layout elements of the respective faults by using an appropriately modeled (simplified) "resistance into delay conversion formula", and acquires an averaged delay defect distribution simplified through appropriate statistical averaging from the delay defect distributions. Hereinafter, the procedure will be described step by step.

At first, the resistive physical defect distribution f(R) may be obtained, for example, in a process evaluation TEG, by checking a defect distribution at an overlapped section of a section extremely exceeding a dispersion range of normal resistance values (e.g., resistance value not smaller than average+3σ=Ro) and a section before becoming suitable to be treated as an open fault (e.g., resistance value of not larger than R1=1 MΩ) ($\int_0^\infty f(R)dR=1$ and $\int_{R0}^{R1} f(R)dR=p(<<1)$).

The defect occurrence rate (frequency) may be obtained by dividing the detected number of defects by "a quantity of target layout elements (the number of VIAs, interconnect length) included in one unit of TEG (e.g., a chain of VIAs [and interconnects])×the measured total number of units".

However, generally, since it is needed for obtaining such a defect distribution to perform a large quantity of measurements, and since it may be considered to be that the shape of the distribution and the defect occurrence rate vary due to an improvement of a yield of the products, it is considered to be that continuously obtaining the high-reliability physical defect distributions is achieved without heavy burden by setting a simple TEG for evaluation in an empty region of a layout of each product, by measuring at the same time of shipment tests of the products, and by accumulating the measurement results.

Figure 2:
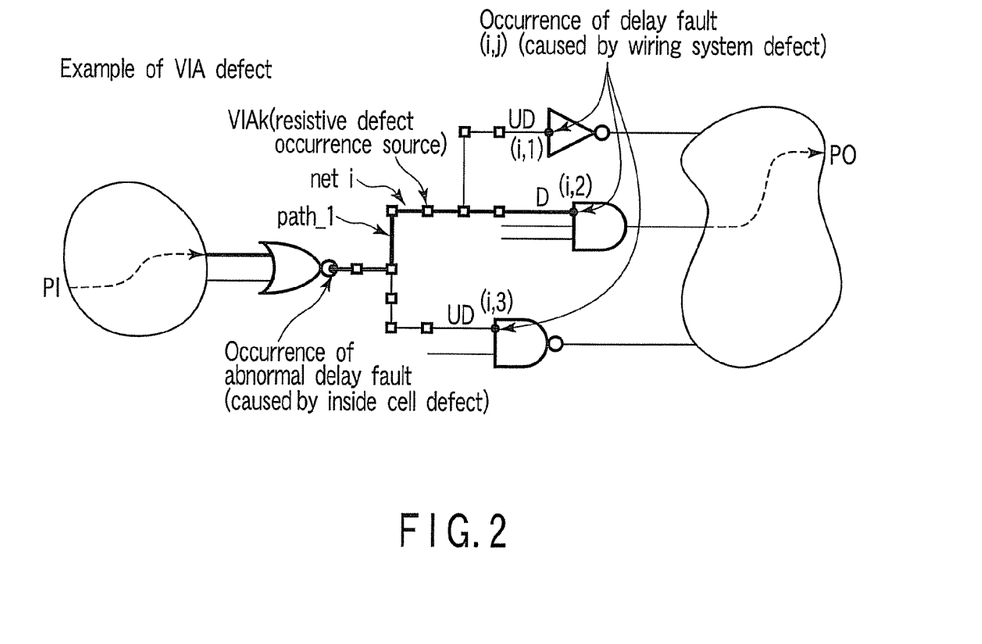
FIG. 2 is a preferred view schematically illustrating an aspect of a distribution of target layout elements on an interconnect.

The association of the distribution of the target layout elements to the delay faults from the layout information of the LSI will be described by referring to FIG. 2. FIG. 2 illustrates schematically an aspect of a distribution of target layout elements (VIAs) on interconnect. The signal in the LSI is propagated by the activation of the logical paths from an external input terminal P1 (plurality is available) of the LSI to an external output terminal PO (plurality is available). Now, a logical net (net) i exiting on the logical path is taken into account. An output terminal of a NOR gate and input terminals of three logical gates (three fan-outs) are connected to the net (i), and transition faults (i, 1), (i, 2) and (i, 3) are assumed thereto, respectively. Now a physical path path_1 (thick full line) as a propagation path of a delay fault to a fault (i, 2) is taken into account, and a resistive open defect of a resistive defect occurrence source (VIAk) is taken into account, the affection of the failure appears at the fault (i, 2) [and, (i, 1)]. Therefore, the affection of the resistive defect (physical defect) of a layout element referred to as the VIAk appears at a delay fault existing at an end edge of the physical path path_1. That is, it is appropriate to add the weight of the target layout element (VIA) to the delay fault (input fault) assumed at the input terminal of each logical gate [the same applies to the fault (i, 3)]. As for delay defect caused by incide cell defect, it appears at the output terminal of the NOR gate. It is possible to assign the defect to the delay fault at the output terminal of the NOR gate, or to those (i, 1), (i, 2), (i, 3) at the input terminals of the three logic gates, depending on modeling of weighted delay faults.

As to the link between the foregoing delay fault and the layout element information, a delay fault-layout element information link file may be defined. The following will describe the example of the link file.

(Example of Delay Fault-Layout Element Information Link file)
net
N_<net ID>:<net name>, <interconnect length on net>,
  <number of VIAs on net>(<single>, <double>), <number of terminal>;
  (definition part of layout element (simple form))
F_<fault ID>: <equivalent fault information>, (slack related information),
  P_<pin ID>,<cell name>/<terminal name>,<in|out>;
•
Path_<path ID>: P_<pin ID>, (layout elements on Path), P_<pin ID>;.
•
endnet
  (Complements)
  equivalent fault information: Representative fault=rep, equivalent fault=eq <fault ID of representative fault>
  <fault ID>: <fault type> serial number, corresponding to each <instance name>/<terminal name>.
  fault type: SR=slow_to_rise SF=slow_to_fall
  slack related information: <minimum detection slack> <clock at a start point> <clock at an end point> <minimum slack> <clock at a start point> <clock at an end point>
  <clock at start point>, <clock at end point> are simply represented by 1, 2, 3, . . . .
  Definition sections of layout elements are granted serial numbers in the whole of the target net for each element.
    inside parentheses is output in the case of full format
    format definition name (ID): information to be described;
  Metal section W<layer1>_<serial number>:<length>, (<coordinate of start point>), (<coordinate of end point>)
  (metal section is a linear section sectioned by VIAs)
  VIA V<layer1><layer2>_<serial number>:(<center coordinate>); (layer1<layer2)
  (Output Example)
net
N_5805838:top.dmac.dma_datablk.s182.N403, 13.60, 5(2, 3), 3;
M2_5805846: 1.60, ;
M2_5805848: 1.90, ;
M3_5805850: 3.70, ;
M3_5805851: 6.40, ;
V23_5805839: ;
V23_5805840: ;
V23_5805841: ;
V23_5805842: ;
V12_5805844: ;
F_SR159283: eqSR33928, TD, 259, 1, 1, 236, 1, P_159283, CND2X1/A, in;
F_SF159283: eqSF33928, TD, 283, 1, 1, 241, 1, 1, P_159283, CND2X1/A, in;
F_SR159284: eqSF53392, TD, 219, 1, 1, 205, 1, 1, P_159284, CND3X1/B in;
F_SF159284: eqSR53392, TD, 230, 1, 1, 219, 1, 1, P_159284, CND3X1/B, in;
F_SR72847: rep, TD, 285, 1, 1, 251, 1, 1, P_72847, CIVX1/Z, out
F_SF72847: rep, TD, 278, 1, 1, 243, 1, 1, P_72847, CIVX1/Z, out
Path_5805852:P_72847,V23_5805841,M3_5805850,V23_58 05842,
M2_5805846,V23_5805839,M3_5805851,V23_5805840,P_15 9283;
Path_5805853:P_72847,V23_5805841,M3_5805850,V23_58 05842,
M2_5805846, M2_5805848,P_159284;
endnet In the above link file, lines of F_SR, . . . , F_SF, . . . , show each delay fault, respectively, and show the corresponding terminal names, Path_. . . enumerates layout element (here, VIA/interconnect element) on a physical path up to each input terminal, and enables clearly grasping the association among the delay faults and the layout element information. The slack indicates a degree of time to spare of timing, the slack related information provides Tmgn and Tdet of each delay fault.

In the conversion formula of 'resistance into delay', generally describes the VIA as follows:

$$D(i,k_{\{j\}},R)=C(i,k_{\{j\}}) \times fLOC(i,k_{\{j\}}) \times R \text{ (VIAk on net (i))}$$

[{j}=(partial) aggregate of faults assumed at a connection destination basic cell input terminals of net (i)]

fLOC is detailed position information of the inside of the LSI logical net of each VIA. The VIAk on the net (i) has a possibility of existing on a plurality of physical paths. That is, since there is some possibility of having an influence on some faults assumed at the input terminals of a connection destination basic cells of the net (i) corresponding to the end point of each physical path, the VIAk is expressed as $k_{\{j\}}$. Using the conversion formula by simplifying it in appropriate modeling makes it possible to obtain the delay defect distribution through a minimum necessary calculation amount. For instance, in the simplest modeling, a method for executing the detailed simulations on some nets, set $C(i,k_{\{j\}})$ to C(i) ("a total load capacitance of net (i)"=sum of total interconnect capacitance on net (i) and input and output capacitance of basic cells, connected to net (i) [in a large scale LSI, influence is apt to become small]), and for replacing the fLOC to an appropriate fixed value n is a possible approach.

Figure 3A:
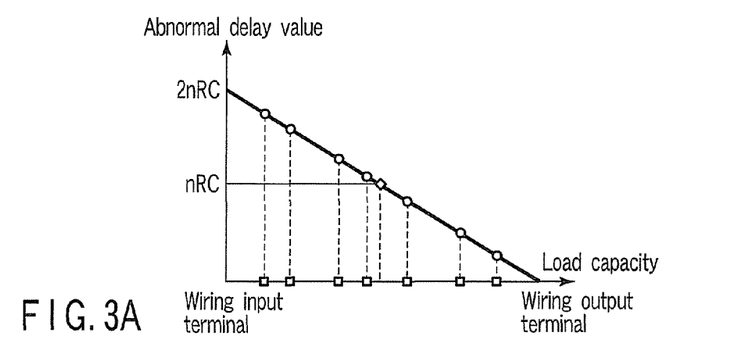
FIG. 3A is a preferred view illustrating a relationship among abnormal delay values and load capacities.

FIG. 3A shows this example (in the case of interconnect without any branch). The lateral axis indicates load capacities from a start point to an end point and from a certain position (a VIA) to an end point, on each net of the LSI. The load capacitance is almost in proportion to the position on the physical path. On the contrary, the longitudinal axis indicates abnormal delays caused by VIA defects (resistance R) which have occurred at each position (if lateral axis is viewed from the output end, the aforementioned conversion formula is made). On the lateral axis, the VIAs existing on the physical path are indicated with white squares, and the corresponding abnormal delays are indicated with white circles (correspondence relationships are indicated with dashed lines).

Figure 3B:
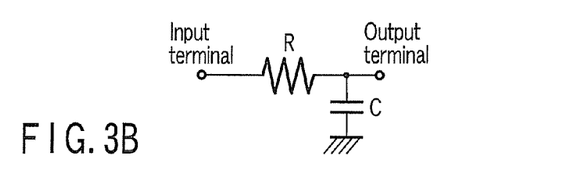
FIG. 3B is a preferred view illustrating an RC net.

Here, it is estimated that the distribution of the VIAs is almost even on the physical path, an abnormal delay value nRC (indicated as a white lozenge) at an averaged position between the start point and the end point of the physical path is set as an averaged abnormal delay value, and this delay value, namely the conversion formula of 'resistance into delay' D=nRC (resistance into delay conversion formula to be used for net (i)) may be applied for all the VIAs on the net (i). If the RC net in a lump formula is assumed (refer to FIG. 3B), the delay risen from the resistive failure of the VIA positioned at an input end of the net (i) is 'RC', and 'n=1/2' is established. However, actually (if precision of approximation is further enhanced), the delay becomes smaller that the given value in many case, so that it is needed to execute a sufficient circuit simulation in response to necessary accuracy and to select a value of n approximately.

Figure 3C:
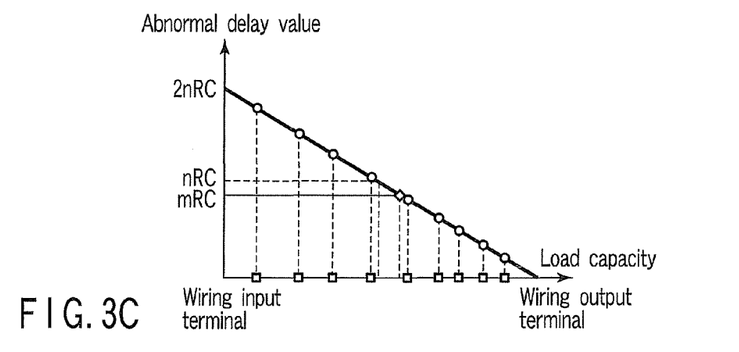
FIG. 3C is a preferred view illustrating another relationship among the abnormal delay values and the load capacities.

As shown in FIG. 3C, there is some possibility of deviation of the distribution of the VIAs on some physical path. Therefore, an averaged abnormal delay value (resistance into delay conversion formula) may be obtained after accurately reflecting relative distances of each VIA (this obtaining equivalents to obtain a resistance into delay conversion formula of net by using fLOC for each individual VIA). Thus, an averaged resistance into delay conversion formula is expressed as 'D=mRC', and m becomes a substantially smaller value than n.

Figure 3D:
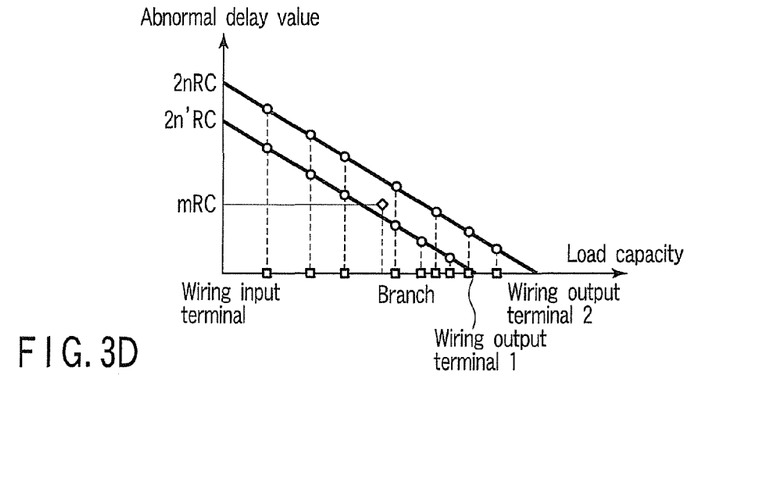
FIG. 3D is a preferred view illustrating another relationship among the abnormal delay values and the load capacities.

Further, if there is any branch in interconnect, a plurality of physical paths exist, in response to this fact, a plurality of resistance into delay conversion formulas exist as shown in FIG. 3D, the VIAs on the side closer to the interconnect input than the branch (VIAs on a plurality of physical paths) gets a delay value by any conversion formula in accordance with the fact that which of physical paths is used for the propagation of the signal (if a plurality of physical paths are used for the simultaneous propagation, the conversion formula which poses the largest delay is applied). Therefore, the averaged resistance into delay conversion formula of the net including the branch may be acquired, for example, by obtaining the averaged abnormal delay value of individual VIAs with taking the frequency of the activation of each physical path (resistance into delay conversion formula corresponding thereto) into account.

Thus, including a generic net with any branch, while it is achieved to obtain resistance into delay conversion formulas by net to which a certain extent of high accuracy is expected and to acquire a delay defect distribution expression to be applied to the whole of the below mentioned LSI, it is also necessary to extract further detailed layout information in comparison to the simplest method. The aforementioned delay fault-layout information link file includes such information (however, it is needed to add a simple tool enabling calculating a terminal capacitance and an interconnect load capacitance from a terminal name and an interconnect length of a basic cell). As understood from the given description, the averaged resistance into delay conversion formula may be obtained in response not to each net but to each physical path in the net (i) (or, fault j assumed at a tip end of each physical path), and may obtain the delay defect distribution on the basis of the 'resistance into delay conversion formula to be used for faults i, j' (mentioned later).

While the given example has been described the resistance into delay conversion formula accompanied by the resistive defect of the VIA, in the case of taking the resistive defect of the interconnect instead of the VIA into consideration, the interconnect may be divided into appropriate size to be extracted (specification of above mentioned delay fault-layout information link may be expanded), and may be processed in a like manner for the above described VIA.

As given above, the some of acquisition methods of the resistance into delay conversion formula have been described from a simple one to an accuracy-improved one. Other than this, (in a delay defect distribution and delay fault test quality), to achieve necessary precision, modeling and approximate methods in a various levels are possible approaches; however these approaches are included in the range of the first embodiment.

Next to this, the acquisition method of the resistance-delay conversion formula generates delay defect distribution $F(i)(D)$ of the individual nets or delay defect distribution $F(i,j)(D)$ of the individual faults on the LSI from the resistance defect distribution $f(R)$ of the VIA by use of the individual net or resistance into delay conversion formula obtained in the given manner. Basically, the following conversion formulas may be used, respectively.

$$F(i)(D) \times dD = NVIA(i) \times f(R) \times dD(i)/dR \times dR$$

$$F(i,j)(D) \times dD = NVIA(i,j) \times f(R) \times dD(i,j)/dR \times dR$$

In the given conversion formulas, $NVIA(i)$, $D(i)$ are each of the numbers of VIAs included in the net (i), and the averaged resistance into delay conversion formula (abnormal delay value) to be applied to the net (i), and $NVIA(i,j)$ and $D(i,j)$ are each of the number of the VIAs included in the fault j of the net (i) (physical bus reaches the fault j) and averaged resistance into delay conversion formula (abnormal delay value) to be applied to the fault j.

Here, especially, the $NVIA(i,j)$ requires to pay attention to some points in treating the VIAs existing on a plurality of physical paths (described later). As mentioned above, the resistance distribution of the VIA resistive defect (resistance defect distribution) $f(R)$ satisfies the following expression.

$$fVIA = \int_{Rmin}^{Rmax} f(R)dR$$

In the fVIA (constant), a VIA is a total occurrence frequency at a resistance section ($Rmin \leq R \leq Rmax$) equivalent to the delay fault among resistive defect by one (approximately equal to occurrence frequency of resistive defect to be measured in TEG), and it is expected that any VIA brings the same value under the same process, at least under the same manufacturing line in the same process. The occurrence frequency of the VIA resistive defects in the entire LSI is $NVIA \times fVIA$ (NVIA: the number of all VIAs inside of LSI). However, a part of the occurrence frequency appears as the delay faults; an object of the present invention is to obtain the delay faults with high precision. Rmin may be set, for example, to an averaged value+3×(standard deviation) of a resistance value of a normal VIA, and Rmax may be set to a resistance value (e.g., 1 MΩ) which may be presumed as an almost open fault at a value larger than the resistance value.

On the other hand, also as to an abnormal delay D, a reasonable section ($Dmin \leq D \leq Dmax$) is set. In the case that a section is one in which a fine delay fault has a substantial meaning, for example, when a clock period is 5 ns (200 Hz), Dmin may be set to about 0.1 ns. Dmax may be set to a delay value, by which the abnormal delay D should be treated not as the fine delay fault but as a transition delay fault, for example, to a clock period. Here is a point to notice that Dmin and Dmax are generally differ from $D(i)(Rmin)$ and $D(i)(Rmax)$ which are obtained by the resistance into delay conversion formula of each net (i) from Rmin and Rmax. The latter satisfies the following relationship together with fVIA, $F(i)(D)$ [the same applies to $F(i,j)(D)$].

$$NVIA(i) \times fVIA = \int_{D(i)(Rmin)}^{D(i)(Rmax)} F(i)(D)dD$$

On the contrary, a quantity by which an occurrence frequency of resistive defects of the VIAs on the net (i) develops as (fine) delay faults is expressed as follows:

$$\int_{D1}^{D2} F(i)(D)dD$$

wherein, $D1=\max\{D(i)(Rmin),Dmin\}$,
$D2=\min\{D(i)(Rmax),Dmax\}$

Figure 4:
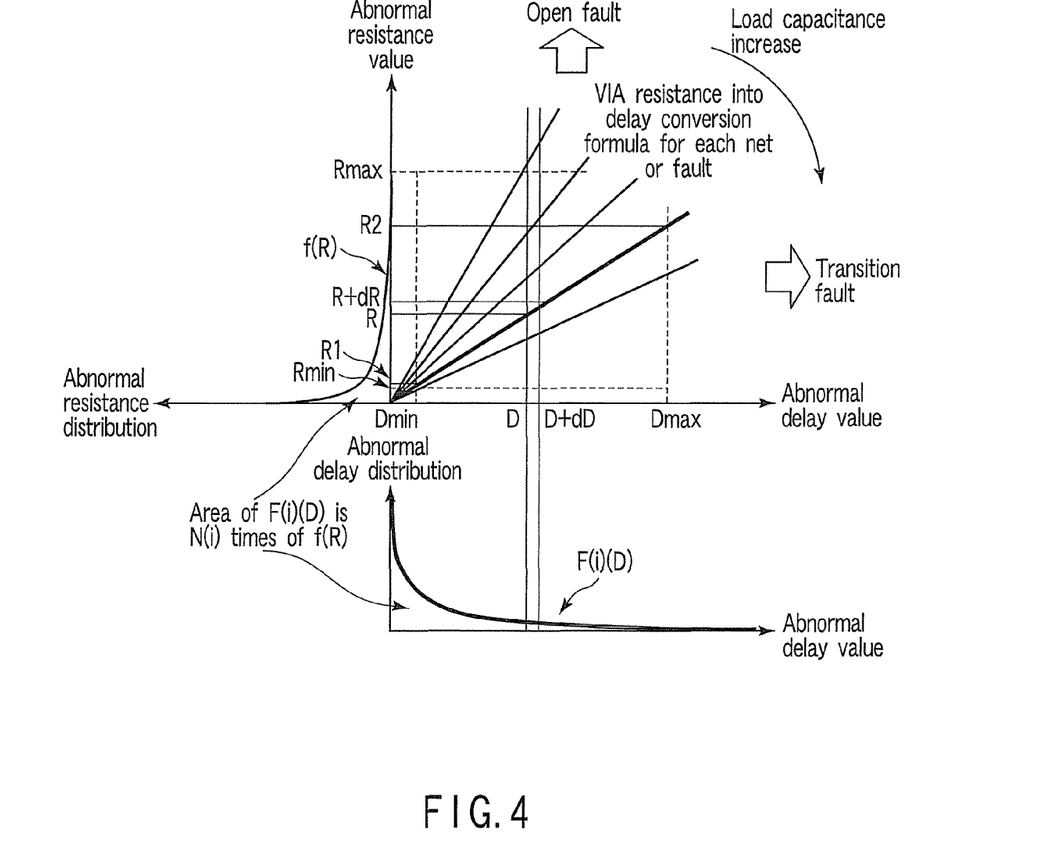
FIG. 4 is a preferred view collectively illustrating a flow until a delay defect distribution averaged in RC nets or faults in the LSI.

The resistance into delay conversion formula expressed with a thick full line in FIG. 4 shows the fact that both D1 and D2 are decided by Dmin and Dmax, respectively, a section (R1 to R2) viewed from the resistance R satisfies the relationships of Rmin<R1, R2<Rmax, then, the expression level as the delay defects of the VIA resistive defects is substantially smaller than NVIA(i)×fVIA. While Rmin and Rmax are especially set to constants here, they may be set to variables depending on the abnormal delay D by taking the possibility of an operation by a larger resistance value if the load capacitance is smaller (smaller in delay) into account (in this case, fVIA has a slightly different value for each VIA). Strictly speaking, also as to Dmax, a value, in which a minimum value or an averaged value of delays passing through each net or physical path is subtracted from the clock period, may be used.

FIG. 4 collectively shows a flow from the acquisition of the resistance defect distribution up to obtaining the delay defect distribution averaged in the nets or faults in the LSI through the resistance into delay conversion formula at one target layout element. The left part of FIG. 4 shows the VIA resistive defect distribution f(R) (turned round at a 90 degree angle), the right upper part thereof shows the resistance into delay conversion formula of each net (or fault). The FIG. 4 shows the fact that in the case of the net with a small load capacitance, even when the VIA resistance becomes larger, the (abnormal) delay does not increase so much; however in the case of the net with a large load capacitance, even if the VIA resistance has a small value, a large (abnormal) delay is caused. The FIG. 4 further shows that if the VIA resistance becomes extremely large, an open fault occurs, and if the (abnormal) delay becomes extremely large, a conventional transition delay fault occurs. At the right lower part illustrates the averaged delay defect distribution of each of the nets or faults in the LSI.

As described above, the obtaining the resistive physical defect distribution f(R) of the target layout elements (common to target layout elements), and the obtaining the resistance into delay conversion formulas of each of the nets or faults including the information of the target layout element amount to be added to each delay fault from the relationships among the resistance into delay conversion formulas of each target layout element appropriately modeled and each of the VIAs and the nets or inside net physical paths (faults at the tip ends thereof) described in the delay fault-layout element information link file make it possible to acquire the delay defect distributions of the individual nets or faults on the basis of the conversion formulas and the resistive physical defect distribution f(R) of the target layout elements. Furthermore, appropriately applying statistic averaging processes to the nets, or faults in the LSI enables obtaining the (statistic) delay defect distribution appropriately averaged in the entire LSI so as to be used for calculating the measure of the delay fault test quality of the entire LSI. As for the (statistic) averaging, some calculation expression will be described hereinafter, and an appropriate one may be selected within the range in which a requirement for, such as an accuracy and execution time is satisfied. Here is a point of notice that each of the following sums should be produced in the nets or faults satisfying the prescribed resistances and the delay sections.

| Unit to be treated | Individual data | Delay defect distribution (Averaging) | Comment |
|---|---|---|---|
| 1) Net | f(i)(D) | $\sum_i f(i)(D)/n(i)/Nnet$ | The simplest approximation |
| 2) Physical path | f(i, j)(D) | $\sum_i \sum_j f(i, j)(D)/Npath$ | Averaging for whole physical paths |
| 3) Physical path | f(i, j)(D) | $\sum_i \sum_j f(i, j)(D)$ $\sum_k 1/m(j, k)/Npath$ | Averaging for whole physical paths (Correct multiplex degree) | wherein, n(i): the number of (input) faults included in net (i), Nnet: the total number of nets, Npath: the total number of physical paths (=the number of input faults)

The following will be described the given sums.

1) This sum expresses the simplest averaging, obtains the layout element information by each logical net (i), and uses the sums of delay defect distributions of each net. However, since the information on branches is not reflected successfully, it seems appropriate for this sum to be used for obtaining an approximate delay defect distribution and for calculating an approximate delay fault test quality.

2) This sum is the sum of the delay defect distributions of the faults corresponding to each physical path on the basis of the layout information extracted for each physical path, and it is expected to further improve the accuracy more than the sum of 1).

3) This sum obtains the delay defect distributions by taking the multiplex degree of the physical paths into account, and appropriately distributes the VIAs shared with other physical paths to each physical path by finding the sum of VIAks on the physical paths toward the input terminal j and 1/m (k) by taking a multiplex degree m(k) into account. Thereby, as a whole, the sum equals to the total number of the VIAs, the influence of the VIAs multiply used in a plurality of paths is appropriately included, and it is expected for the delay defect distribution f(D) matched to the actual status to be obtained. The foregoing multiplex degree may be easily obtained by counting the times of appearances of each VIA in the path in each item of net information of the aforementioned fault-layout information link file.

Figure 5:
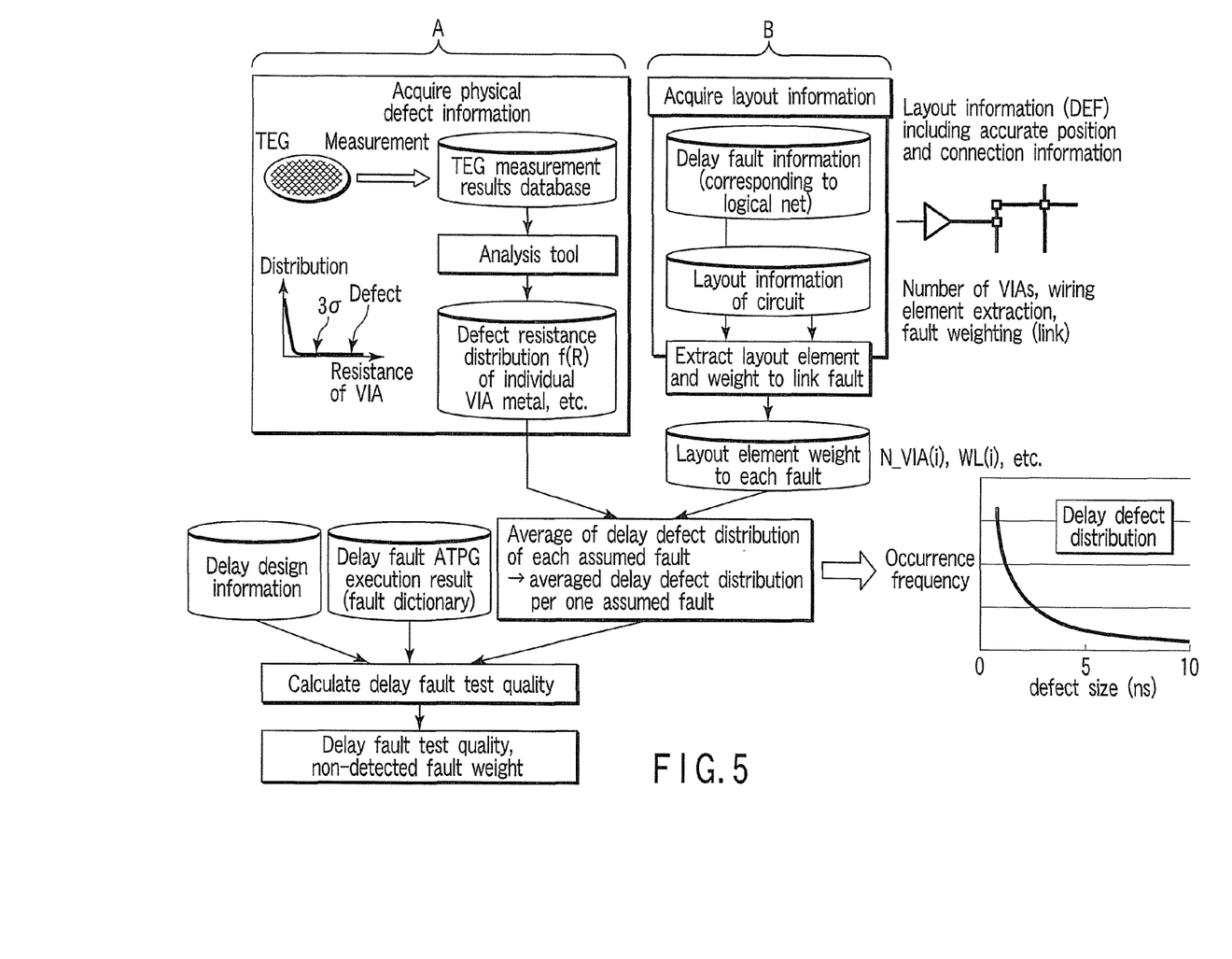
FIG. 5 is a preferred view illustrating an execution flow in accordance with the first embodiment of the invention.

At last, FIG. 5 shows an execution flow of the first embodiment. In FIG. 5, the symbol A indicates an acquisition flow of the physical defect distributions to be expressed as the abnormality of the resistances or the currents in the TEG measurement.

On the other hand, in FIG. 5, the symbol B indicates a delay fault-layout element information link, and a flow of layout element information weighting to the delay faults on the basis of the detailed layout information and the logical net information (corresponding also to delay fault information). (However, wherein, it is not necessary to describe a concrete delay fault test result in the delay fault-layout element information link file.) Further, operating appropriate statistic averaging based on the physical defect distributions and the resistances into delay conversion formulas (model formulas) for each net or fault, enables obtaining the delay defect distributions. After this, the flow calculates the contribution to the delay defect distributions in the not-detected region of each fault from the Tmgn (i) (delay design information) of each fault obtained by the static timing analysis to the LSI and the Tdet (i) of each fault calculated from the result of the delay fault test by using the delay defect distribution F(D), finds the sum of all faults, then, the flow may obtain the delay fault test quality. More specifically, the flow may calculate in accordance with the following equations. (The same as that of patent document 1 applies to this flow. However, the delay defect occurrence [remaining] rate is calculated. The summing is performed only for the input faults.)

(Delay fault test quality of [input] fault i)

$$DL(i) = \int_{Tmgn(i)}^{Tdet(i)} F(D) dD$$

(Delay fault test quality of whole of LSI)

$$DL(LSI) = \sum_i DL(i)$$

[Second Embodiment]

Figure 6:
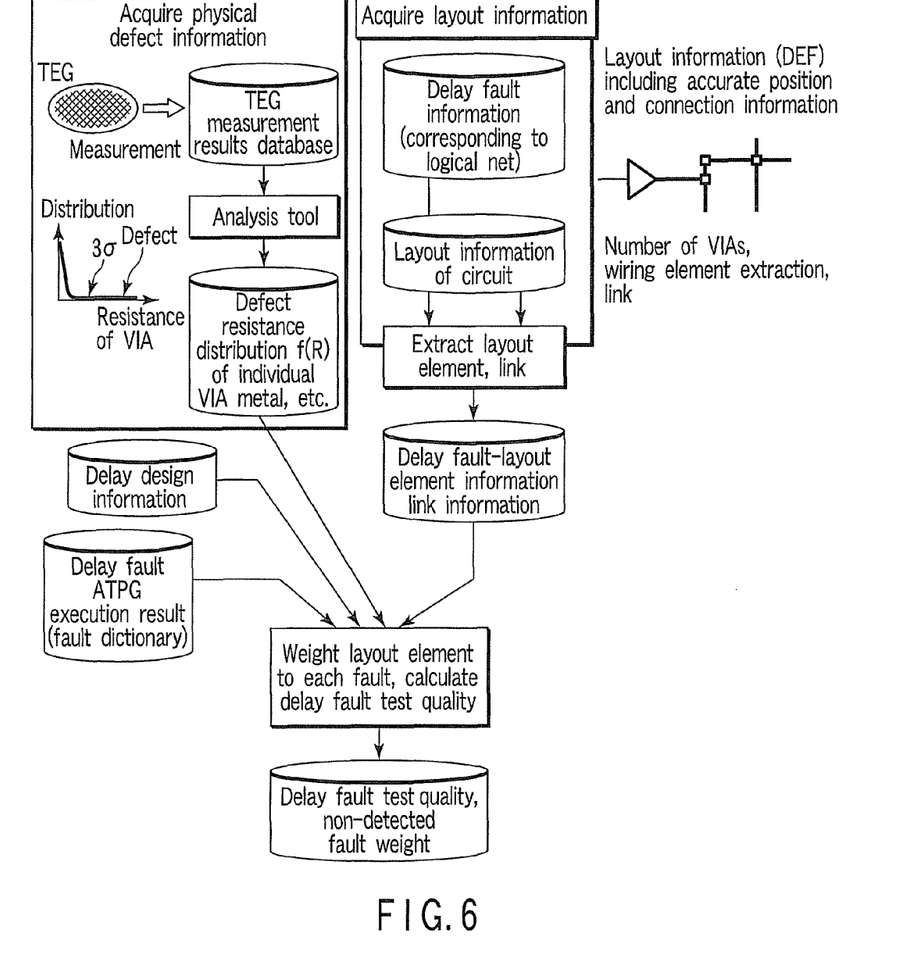
FIG. 6 is a preferred view illustrating an execution flow in accordance with the second embodiment of the invention.

Hereinafter, the second embodiment will be described with reference to FIG. 6. The delay defect distribution in the first embodiment obtains the distribution of the target layout element amount capable of being associated with each delay fault extracted from the LSI and obtains the delay defect distribution for each net or fault by using the resistance into delay conversion formula which has been modeled (simplified) with appropriate accuracy, and obtains the averaged delay defect distribution to be applied to all faults with relative ease by applying (statistic) averaging operations which have been determined as suitable operations to these delay defect distributions. Based on the obtaining results, the delay fault test quality to be achieved through the test pattern applied to the LSI is obtained. However, as mentioned above, there are a various steps in the appropriate averaging operation, and to secure necessary precision, it is needed to execute the circuit simulations in many cases. Moreover, although, in the first embodiment, the amount of the physical defect distributions (occurrence distributions) corresponding to the individual faults may be extracted with high precision with respect to the target layout elements from the layout information of the LSI, the delay fault test quality is calculated once through the averaging that is the delay defect distribution. The delay defect distribution before applying the test pattern is obtained, and it is not easy to employ an appropriate processing (modeling) method for the VIAs, etc., on a plurality of physical paths. In contrast, it is relatively easy to calculate the delay fault test quality after applying the concrete test pattern to the LSI.

Therefore, in the second embodiment, the measure of the delay fault test quality may be directly calculated from a status in which the delay defect distributions are defined to the individual faults. Actually, since, if the target layout element amount, the physical defect distribution f(R) and the resistance into delay conversion formula corresponding to each fault can be defined, the delay defect distribution f(i)(D) or f(i,j)(D) of each fault i or (i,j) may be obtained, the delay fault test quality of the whole of the LSI may be obtained by calculating the contribution to the measure (defect rate) of the delay fault test quality by each fault in the not-detected region using the foregoing Tmgn(i) and Tdet(i) and by summing all faults. This process will be described further specifically with reference to FIG. 7. Now, it is assumed that, as a result of applying a test pattern appropriately detecting the delay fault to the LSI, the delay fault assumed at an input terminal j1 of a NAND gate (namely, a delay fault occurring on a physical path from an output terminal of an AND gate to the input terminal j1 thereof) and a delay fault assumed at an input terminal j2 of a buffer (namely, a delay fault occurring on a physical path from an output terminal of the AND gate to an input terminal j2 thereof) have been detected as slack values S_j1 and S_j2 (S_j1<S_j2), respectively.

Figure 7:
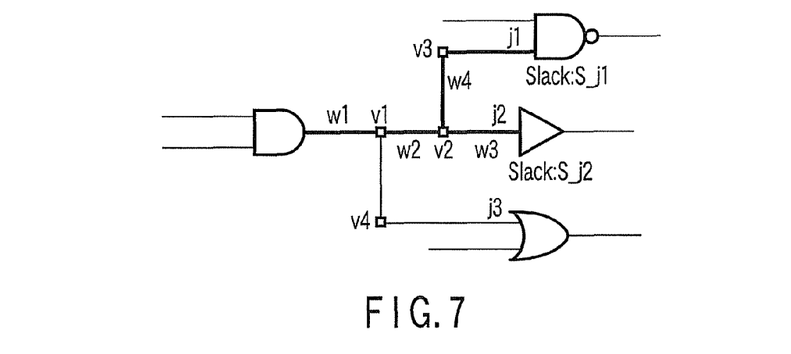
FIG. 7 is a preferred view illustrating a method of acquiring detection information for each VIA (target layout element) on interconnect sections.

In this case, since it is presumed that the interconnect parts which have been detected duplicatedly are detected in the smallest slack, the slack values corresponding to the interconnect parts w1, w2, w3 and w4 (each indicated with thick full line) become S_j1, S_j1, S_j2 and S_j1, respectively. As to the interconnect part w1, the physical paths up to an input terminal j3 being duplicated, the fault assumed at the input terminal j3 is not detected yet, and the slack value of interconnect part except w1 is assumed at least equal to or larger than a test frequency (>S_j2).

Like this, the delay fault test quality may be obtained directly by obtaining the slack values so as to take a minimum slack in the case of being shared with a plurality of physical paths for each VIA corresponding to the interconnect parts separately extracted by using the fault-layout element information link file, by individually calculating the occurrence frequency amounts corresponding to the not-detected spots on the delay defect distribution by using the physical defect (resistance) into delay conversion formula corresponding to each VIA through the similar procedure described in the first embodiment, and by obtaining these slacks values and frequency amounts for all nets or faults.

Like this, the second embodiment differs from the first embodiment, although there is a need to directly calculate the measure of the delay fault test quality from the status of defining the delay defects to the respective faults, the second embodiment has an advantage that it may directly obtain the delay fault test quality corresponding to the test pattern applied to the LSI to achieve the high accuracy without having to perform a kind of averaging operation to obtain the delay defect distribution. In the layout element extraction process in FIG. 6, the foregoing delay fault-layout element information link file is output as delay fault-layout element information link information in a form in which concrete slack information is not described, in a process of weighting the layout element to each fault and a process of calculating the delay fault test quality, the concrete slack information is described on the basis of delay design information (static timing analysis information) and a delay fault ATPG execution result (fault dictionary), and becomes a link file including complete information. In this case, the delay fault test quality may be calculated after creating once a complete delay fault-layout element information link file; however the delay fault test quality may be directly calculated from the aforementioned delay fault-layout element link information, the delay design information and the execution result of the delay fault ATPG.

[Third Embodiment]

Figure 8:
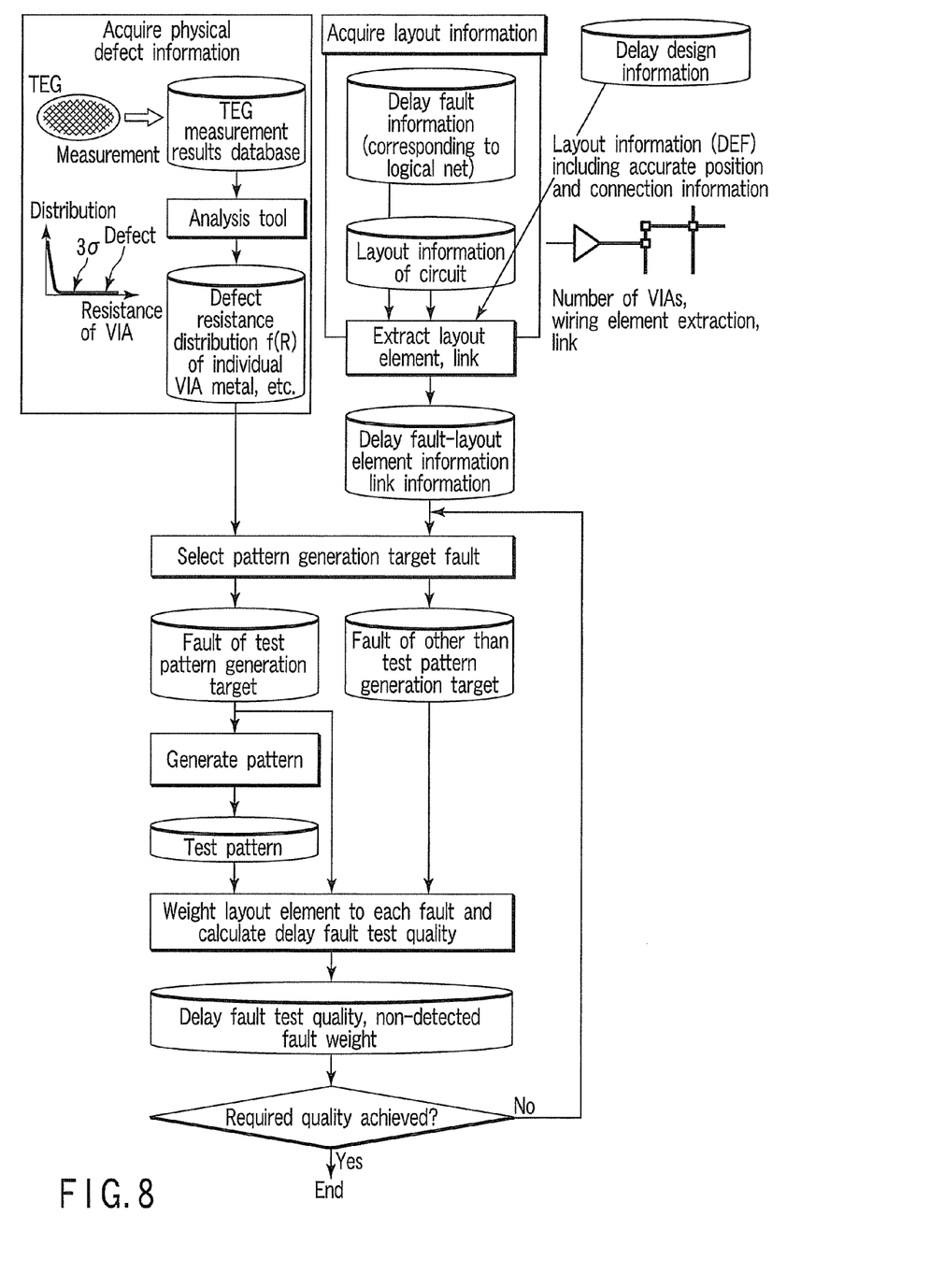
FIG. 8 is a preferred view illustrating an execution flow in accordance with the third embodiment of the invention.

The following will describe the third embodiment by referring to FIG. 8.

By utilizing the delay fault-layout element information link and the weighting method for each fault described in the foregoing embodiment, a fault to be preferentially detected becomes clear. Specifically, the third embodiment preferentially sets objects with heavy weight from among the not-detected faults as the object for the generation of the test pattern. Thereby, it is expected that a test pattern with high delay fault test quality may be efficiently obtained, and that a small-sized test pattern may be obtained. In FIG. 8, the calculation apparatus regarding the third embodiment describes the delay design information in advance in the delay fault-layout element information link information. The calculation of the weight of not-detected faults may decrease the execution time by calculating the additional detection part of the not-detected part at every generation of additional test pattern after calculating the weight of detected and not-detected faults of the entire target LSI in a first loop.

[Fourth Embodiment]

Hereinafter, the fourth embodiment will be described.

While the first, second and third embodiments have been described the delay fault test quality calculation apparatuses which obtains the delay fault test quality caused by the physical defects of the layout elements of interconnect of the basic cells, the present invention may be embodied for calculating the delay fault test quality caused by the resistive physical defects of the layout elements inside the basic cells. (Although the content of the fourth embodiment is applicable to a macro cell of a memory, etc., hereinafter simply referred to as a 'cell' and the macro cell, etc., are included therein.)

Figure 9:
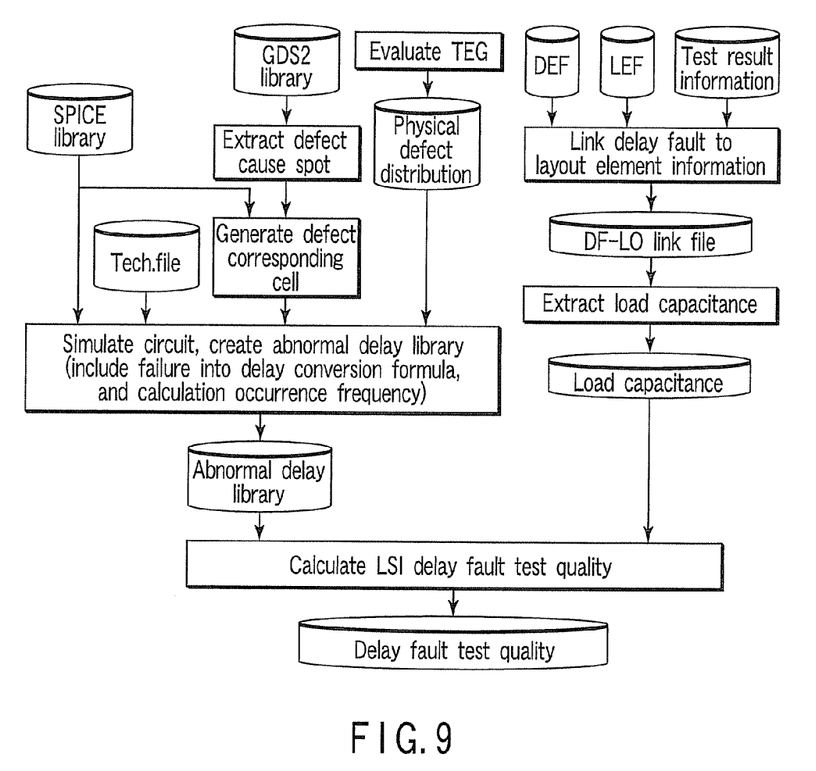
FIG. 9 is a preferred view illustrating an execution flow in accordance with the fourth embodiment of the fourth embodiment.

A resistive physical defect capable of occurring in a cell includes a resistive open of a minimum-size contact or a minimum VIA in a cell (hereinafter referred to merely a contact or a VIA), a reduction in driving force (increase of on current) of a PMOS/NMOS element, an increase in off current between a source and drain, and a short-circuit among interconnects in a cell. Since the whole of the affection on delays accompanied by these defects appear at an output terminal of each cell (an input terminal of each net), it is natural that the weights of related layout elements are added to the fault assumed at the output terminal of the cell [the weight may be added by diving it appropriately to the fault to be assumed at an output terminal (input terminal of cell) of each net]. Since the load capacitance on each defect becomes an entire load capacitance of the connected net, there is no need to extract the detailed position information like the case of the resistive defect of the VIA at the interconnect among cells in extracting the layout information. However, since the concrete way of appearance of the abnormal delay accompanied by these defects (any one of dependency on resistance, occurrence frequency, rise/fall, etc.) are all different due to causes, and acquisition of the resistance into delay conversion formulas suitable for each defects needs a large number of circuit simulations, the calculation apparatus may extract the spots at which the resistive physical defects to be the cause of the delay for each cell from an actual layout (GDS2), and may respond in turn from the important defects by determining from the size and occurrence frequency of the abnormal delays to be estimated from the physical defect distribution information acquired from the TEG, etc., an advance simulation result at a circuit with a defect inserted therein, and an amount (region) of related layout elements (spots). The basic flow from the extraction of the resistive defects in the cell up to the calculation of the delay fault test quality caused by the defects is as follows (refer to FIG. 9):

1) Extraction of the spots at which the resistive defects possibly occurs from an actual layout and determination of the priority (described above).

2) Creation of an abnormal delay library for the principal resistive defects on the basis of the circuit simulation implementation (normal circuit and defective circuit) in a cell level.

3) Creation of the delay fault-layout element information link file and extraction of capacitance information on the basis of layout information (DEF) of LSI and of the detected and non-detected information of a result of applying a test pattern.

4) Calculation of the delay fault test quality of the LSI on the basis of the abnormal delay library of 2) and the capacitance information of 3).

The aforementioned 1) and 2) prepare the abnormal delay information of each cell as libraries, and one-time created libraries are applicable as they are to the LSIs using the same library. The abnormal delay library of 2) is created by comparing the circuit simulation results between a normal circuit and a circuit with a resistive defect inserted therein and by extracting the difference of the delays as the abnormal delay, and includes a resistive defect into delay conversion formula and an estimated occurrence frequency to a 'reference' load capacitance. As to the reference load capacitance, generally, a load capacitance range connectable to each cell is approximately decided, and the averaged load capacitance may be selected. Depending on the kinds of the defects, the delay cannot be expressed by a linear expression and the conversion formula cannot be easily modeled sometimes. In such a case, an appropriate conversion formula may be obtained by invoking the Monte Carlo simulation. In 3), the flow calculates the cell to drive each net and the load capacitance for the cell. Since an interconnect length is extracted in the delay fault-layout element information link file shown in the first embodiment, there is a need to calculate the total load capacitance from the interconnect length, the name of a connection destination cell, etc.; however, the calculation may be obtained at the same time of the creation of the link file. In the foregoing 2) and 3), to surely activate the defects to be detected and to correctly evaluate the influences on the delays, it is necessary to acquire the input information to the cell; however the input information is not included in the delay fault-layout element information link file depicted in the first embodiment. Therefore, it is needed to expand the specification so as to describe the input information of the basic cell to drive each net in the same link file, and it is necessary to extract the input information in extracting the layout information. If the flow does not acquire the input information, obtaining a probability of detection on the basis of the number of combinations of inputs to the cell enables securing a certain extent of suitability. In the foregoing 4), the delay defect distribution at each fault (corresponding to each net) may be calculated on the basis of the main resistive defect into delay conversion formula information and occurrence frequency information at the reference load capacitance described in the cell abnormal delay library of the 2), and of the load capacitance information at each net of the 3), and may calculate the delay fault test quality caused by the defect in the cell of the LSI, for example, in the same method of the second embodiment. The entire delay fault test quality (defect remaining rate) of the LSI may be obtained by the sum of the delay fault test quality caused by the defects inside the cell and the delay fault test quality caused by the defects among the cells.

Figure 10:
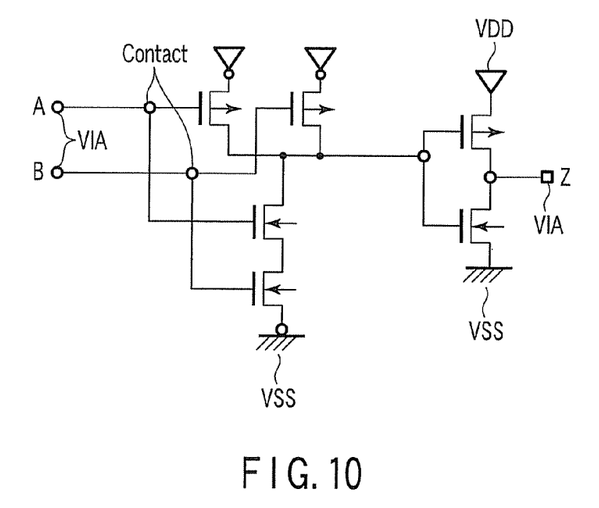
FIG. 10 is a preferred circuit view illustrating a configuration example of a two-input AND gate.

Hereinafter, described contents of the abnormal delay library will be described by giving an example of a two-input AND gate (two-input NAND gate+inverter) in FIG. 10. A generic actual layout is not shown specifically; 'a white circle' indicates a contact, 'a white square' indicates a VIA, and 'a white triangle' indicates a power supply (VDD). Among them, since a resistive defect of a contact between a power supply (VDD) and a PMOS source, and a resistive defect of a contact between a grounded point (VSS) and an NMOS source have strong influences on the delays, they are illustrated as the failures to occur the abnormal delays. The following format will describe the examples of these expressions. The last item of Input expresses the total number of combinations capable of being input and the number of combinations to be targeted. The first item of Abnormal Delay represents a signal variation to be affected. Although a delay occurs in charge from the PMOS by a resistive open defect of a contact between PMOS source and power supply (VDD), the delay is output through an inverter, the delay is expressed as Fall. The second item gives the resistive defect into (abnormal) delay conversion formula. For instance, in the expression of "0.90(1c)–0.03(2c)", the figures in parentheses indicates the order and the symbol c indicates that the (RC) becomes variables, and the real number in front of parentheses indicates a coefficient, then, the expression represents "D=0.90×(RC)–0.03×(RC)$^2$". This equation and the coefficients may be obtained from the difference between the normal cell and the circuit simulation result in the cell with the defect inserted therein. Depending on the case, there is a possibility that it is preferable to make a variable by R not by (RC), in such a case, only the order is described in parentheses. The third item represents the conditions of the load capacitance in obtaining the second item (basically, a reference load capacitance is used). If it is hard to express in a single equation because the conversion formula is complicated, the conversion formula may express the load capacitance range and a plurality of conversion formulas may be used. "Distribution of R" expresses the distribution of the defective resistances, and it goes along with the similar expression to the second item of "Abnormal Delay".

(Format example) "AND2"

Additional delay by contact resistive open between NAND2: PMOS source and VDD
 Distribution of R: 1.54E-8(–2);
 Input: A=0 B=0 1/4, A=0 B=1 2/4;
 Abnormal Delay: Fall 0.90×(1C)–0.03×(2C) 50fF;

Additional delay by contact resistive open between NAND2: NMOS source and VSS
 Distribution of R: 1.54E-8(–2);
 Input: A=1 B=1 1/4;
 Abnormal Delay: Rise 1.22×(1C) 50fF;

As for the increase in on-resistance of the NOMOS and PMOS devices, there is some possibility that the increase therein becomes easier to be treated by using a power supply current (drain-source current) Ids as a parameter rather than by using the on-resistance itself, and a conversion formula using the Ids as a variable may be useful.

According to the foregoing embodiment, since the calculation apparatus obtains the delay defect distribution on the basis of the physical defect distribution (using a characteristic resistance value or a current value as a variable) of individual circuit and layout elements (their combination) possible to be the cause of the delay fault of the target semiconductor integrated circuit (LSI), of the delay fault to be defined on the logical net (including the input and output terminal of the basic cell) to which the circuit and layout elements to be extracted from the detailed layout information of the LSI are added as the weights, and of the appropriate resistance-delay conversion model, and obtains the delay fault test quality by means of the test pattern for the target LSI, or obtains the delay fault test quality without passing through the delay defect distribution, it becomes able to obtain the measure (metric) of the delay fault test quality directly and precisely associated with the defect occurrence distribution in the process, which has been difficult for the conventional method based on the delay defect distribution without a clear evidence. For instance, it becomes able to directly compare the delay fault test quality among different kinds of products on the same manufacturing line by using the defect occurrence rate of the individual layout elements as a parameter, and it becomes able to improve the precision of the delay fault test quality. As a result, the calculation apparatus can extract the important physical defect to efficiently improve the delay fault test quality on the basis of the defect occurrence frequency data of the manufacturing line. The foregoing embodiment proposes the method for effectively generating the delay fault test pattern, based on the layout element weight added to each fault of the individual products. Thereby, a delay fault test pattern with a small size and high quality can be generated.

While the present invention has been described in accordance with some embodiments, the invention is not limited to the specific details and representative embodiments shown and described herein, and in an implementation phase, this invention may be embodied in various forms without departing from the spirit or scope of the general inventive concept thereof.

Each of the foregoing embodiments includes inventions in various phases; the inventions in the various phases can be extracted by appropriately combining a plurality of constituent elements disclosed in the foregoing embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A delay fault test pattern generation apparatus for generating a delay fault test pattern, comprising:

a defect distribution extraction unit which extracts a physical defect distribution of resistances or currents caused by a physical defect related to layout elements or a combination of the layout elements composing the semiconductor integrated circuit;

a delay fault-layout element information extraction unit which extracts the layout elements or the combination of the layout elements with interconnect wiring information including location information, interconnect capacitance and a delay fault to be associated with inside the semiconductor integrated circuit as delay fault-layout element information by associating the layout elements or the combination thereof with delay faults to be assumed inside the semiconductor integrated circuit, the delay fault resulting from a value obtained from the resistance and interconnect capacitance of the layout element or the combination thereof;

a delay defect distribution calculation and weighting unit which calculates a distribution of delay defect on the basis of the distribution of the resistance or current and adds weight to each of the delay faults on the basis of the delay fault-layout element information;

a test pattern generation unit which preferentially generates the delay fault test pattern for un-detected delay faults with large weight on the basis of weight of the delay faults to which the weight is added by the delay defect distribution calculation and weighting unit; and a delay fault test quality calculation unit which calculates the delay fault test quality on the basis of delay design information of the semiconductor integrated circuit, detection information of the test pattern to test the semiconductor integrated circuit, execution conditions of the test, the delay defect distribution of resistance or current caused by physical defects, and the weights.

2. The delay fault test pattern generation apparatus according to claim 1, wherein
the delay defect distribution calculation and weighting unit obtains a distribution of delay defect caused by a distribution of resistance caused by physical defects of VIAs to each delay fault by using a resistance into delay conversion formula.

3. The delay fault test pattern generation apparatus according to claim 2, wherein
the resistance into delay conversion formula is expressed by an equation as follows:

$$D(i,k_{U}\},R)=C(i,k_{U}\})\times fLOC(i,k_{U}\})\times R$$

[VIAk on net (i)]
[{j}=(partial) aggregate of delay faults assumed at a connection destination basic cell input terminals of net (i)]
wherein, fLOC is detailed position information of each VIA inside an LSI logical net (i).

4. The delay fault test pattern generation apparatus according to claim 1, wherein
the delay fault test quality calculation unit calculates the delay fault test quality by an equation expressed as follows:

$$DL(i) = \int_{Tmgn(i)}^{Tdet(i)} F(D)\,dD$$

[delay fault test quality of (input) fault i]
DL(LSI)=$\Sigma_i$DL(i)
(delay fault test quality of whole of semiconductor integrated circuit)
wherein, F(D) is the delay defect distribution, Tmgn(i) is delay design information of the semiconductor integrated circuit, Tdet(i) is detection information of the test pattern.

5. The delay fault test pattern generation apparatus according to claim 1, wherein
the delay defect distribution is continuously obtained by measuring test element groups for evaluation at shipment tests of products, and by accumulating the measurement results.

\* \* \* \* \*